(12) United States Patent
Schreiber et al.

(10) Patent No.: US 6,456,219 B1
(45) Date of Patent: Sep. 24, 2002

(54) ANALOG-TO-DIGITAL CONVERTER INCLUDING TWO-WIRE INTERFACE CIRCUIT

(75) Inventors: Robert M. Schreiber, Tucson, AZ (US); Binan Wang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/510,519

(22) Filed: Feb. 22, 2000

(51) Int. Cl.$^7$ .............................................. H03M 1/12
(52) U.S. Cl. ...................................... 341/155; 341/143
(58) Field of Search ................................ 341/143, 144, 341/155

(56) References Cited

U.S. PATENT DOCUMENTS

| | | | |
|---|---|---|---|
| 3,639,694 A | 2/1972 | Deutsch et al. ................ 179/15 |
| 4,689,740 A | 8/1987 | Moelands et al. ........... 364/200 |
| 4,746,899 A | 5/1988 | Swanson et al. ............ 340/347 |
| 4,943,807 A | 7/1990 | Early et al. ................. 341/120 |
| 5,257,026 A | 10/1993 | Thompson et al. .......... 341/118 |
| 5,375,146 A | 12/1994 | Chalmers .................... 375/103 |
| 5,559,502 A | 9/1996 | Schutte ................... 340/825.21 |
| 5,594,442 A | 1/1997 | Paulos et al. ............... 341/143 |
| 5,604,918 A | 2/1997 | Huijsing et al. ............. 395/382 |
| 5,646,621 A | 7/1997 | Cabler et al. ............... 341/143 |
| 5,710,890 A | 1/1998 | Hermer ....................... 395/286 |
| 5,736,848 A | 4/1998 | De Vries et al. ............ 324/142 |
| 5,821,890 A | 10/1998 | Kim et al. ................... 341/143 |
| 5,886,658 A | 3/1999 | Amar et al. ................. 341/155 |
| 5,903,737 A | 5/1999 | Choon Han ................. 395/280 |
| 5,923,273 A | * 7/1999 | Pastorello ..................... 341/77 |
| 5,952,947 A | 9/1999 | Nussbaum et al. .......... 341/143 |
| 5,963,159 A | 10/1999 | Abughazaleh et al. ....... 341/139 |
| 6,147,631 A | * 11/2000 | Maulik et al. ............... 341/122 |
| 6,169,501 B1 | * 1/2001 | Ryan ........................... 341/101 |
| 6,208,279 B1 | * 3/2001 | Oprescu ...................... 341/143 |

* cited by examiner

*Primary Examiner*—Peguy Jeanpierre
(74) *Attorney, Agent, or Firm*—W. Daniel Swayze, Jr.; W. James Brady; Frederick J. Telecky, Jr.

(57) ABSTRACT

An analog-to-digital converter includes a delta sigma modulator (103) adapted to produce a stream of pulses (104) the density of which represents the amplitude of an analog input signal ($V_{IN}$) coupled to an input of the delta sigma modulator. A decimation filter (105) is coupled to filter the stream of pulses and produce a digital word (106) representing the amplitude of the analog input signal. A serial interface circuit (109) is coupled to serially receive the bits of the output word and serially shift the bits of the digital word to a data terminal (110). A timing generator (17) produces timing signals to control operation of the delta sigma modulator and the decimation filter and generates a conversion done signal (21) indicative of completion of conversion of the analog input signal ($V_{IN}$) into the digital word. A control circuit (107) produces a data ready signal (32) on the data terminal (110) in response to the conversion done signal and causes the serial interface circuit to serially shift the bits of the digital word onto the data terminal in response to a digital control signal (SCLK).

30 Claims, 4 Drawing Sheets

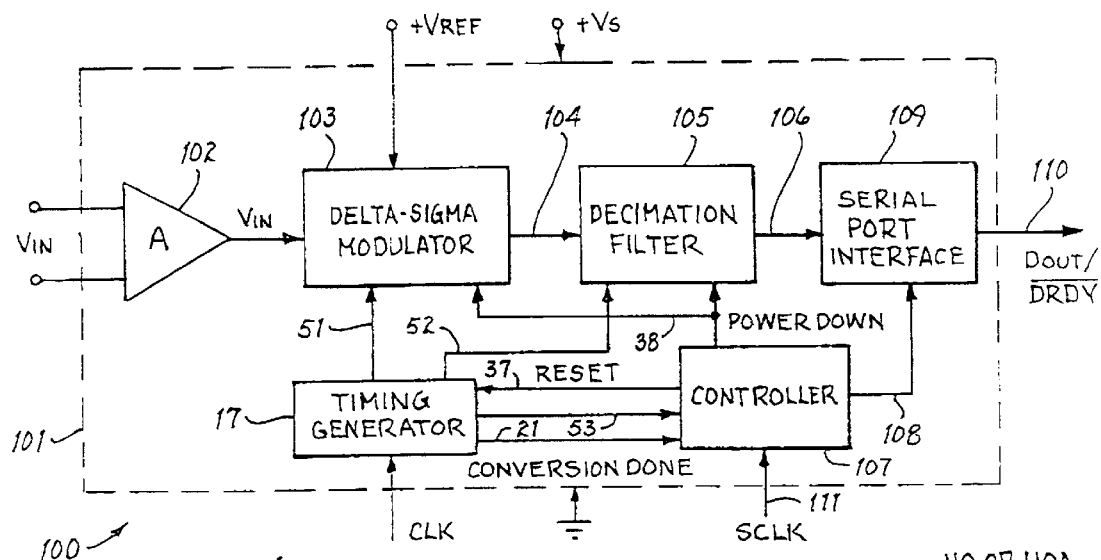
FIG. 1
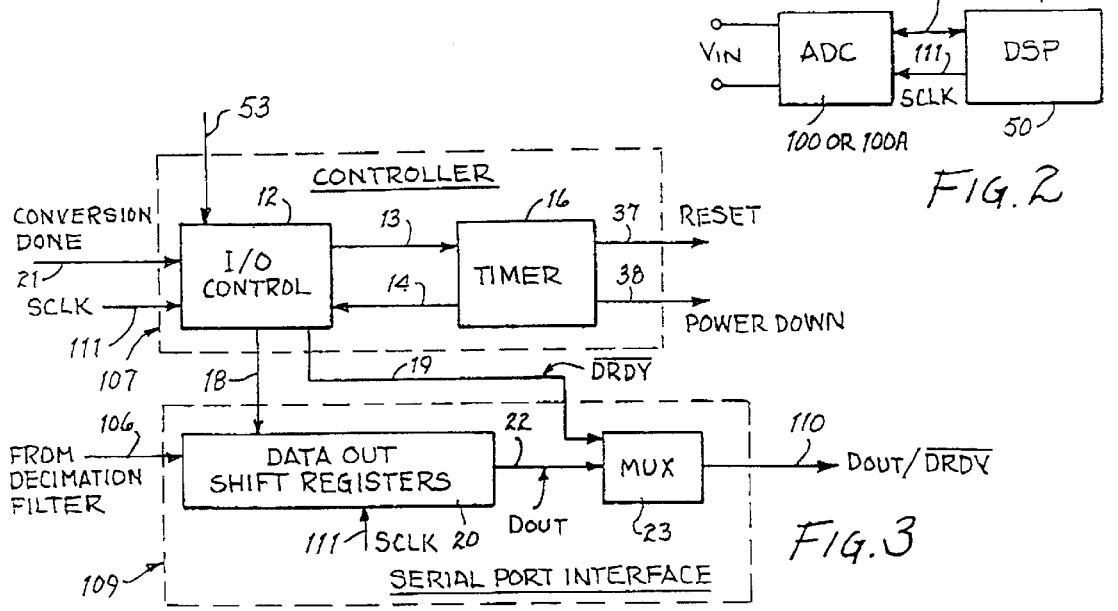
FIG. 2
FIG. 3
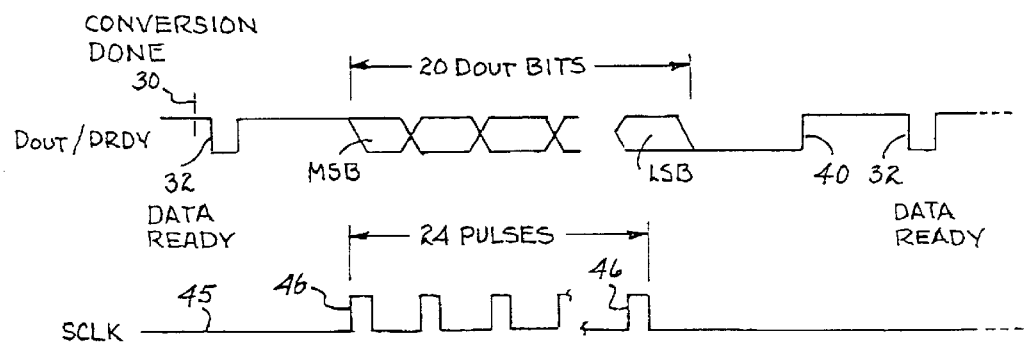
FIG. 4

ANALOG-TO-DIGITAL CONVERTER INCLUDING TWO-WIRE INTERFACE CIRCUIT

BACKGROUND OF THE INVENTION

The invention relates to an analog-to-digital converter integrated circuit which requires only a single data terminal and a single control terminal to provide communication with a controller to enable the controller to read a digital word representing an analog signal input to the analog-to-digital converter. The invention also relates to an embodiment of the analog-to-digital converter which is programmable via the data terminal.

Many systems require frequent conversion of analog signals into digital signals to be operated upon by a digital system, such as a microcontroller system or a digital signal processor (DSP) system. Consequently, there is a need for an inexpensive integrated circuit analog-to-digital converter (ADC) which can be conveniently and inexpensively coupled between the source of the analog signal (which typically might be an analog voltage or current signal) and the digital system. For a delta sigma ADC that receives an analog signal as a differential signal and utilizes an external reference voltage and an external system clock signal, at least six leads are required in addition to the leads required for communicating with the digital system. The six additional leads referred to include two leads for receiving the differential analog input signal, one lead for receiving the system clock signal, one lead for the supply voltage, one lead for the ground voltage, and one lead for the external reference voltage. If the analog-to-digital converter is to be packaged in a standard, economical 8-lead package, only two leads are available for connecting the ADC to the digital system.

Conventionally, delta sigma analog-to-digital converters are interfaced with microcontrollers using either a four-wire interface circuit, such as a standard SPI interface using a SCLK clock signal terminal, a data input terminal, a data output terminal, and a chip select terminal, or a similar three-wire interface circuit that eliminates the chip select terminal. In addition, a data valid terminal often is required.

One prior approach to making more leads available for communication between the ADC and the digital system is to provide the analog input signal as a single-ended signal rather than a differential signal. However, this results in analog-to-digital conversion inaccuracies caused by differences between the external ground voltage and the internal ground voltages.

Other prior techniques for making more leads available for communication between the ADC and the digital system has been to provide a precision internal voltage reference circuit and/or an internal clock signal source in the ADC integrated circuit chip. However, this greatly increases the chip size, which increases the chip cost and may prevent the use of presently available standard 8-lead packages such as an SOIC package.

So-called two-wire $I^2C$ interface systems can accomplish digital communication between a "slave" component and a "master" component using only two leads. However, each slave component must be addressable in the sense that it must store a unique address so it can respond to the unique address when the master presents it on the $I^2C$ bus. This requires providing circuitry for individually setting up the addresses in each slave device, either by providing additional leads or by using non-volatile memory elements. Both of these approaches to dealing with the addresses required in an $I^2C$ system are expensive and are inconsistent with the objective of providing an analog-to-digital converter which receives a differential input, external system clock, and external reference voltage in an 8-lead package.

Thus, there is a need for a non-addressable inexpensive analog-to-digital converter integrated circuit receiving a differential analog input signal, and utilizing an external reference voltage and an external clock signal, which is capable of operatively communicating with a digital system utilizing only two leads.

SUMMARY OF THE INVENTION

Accordingly, it is an object of the invention to provide a non-addressable integrated circuit delta sigma analog-to-digital converter which receives an analog input signal, an external reference voltage, and an external clock signal, and is capable of communication with a digital system by means of only two conductors.

It is another object of the invention to provide a flexible, low power, non-addressable integrated circuit delta sigma analog-to-digital converter which receives a differential analog input signal, an external reference voltage, and an external clock signal, and is capable of communication with a digital system by means of only two conductors.

It is another object of the invention to provide a non-addressable integrated circuit delta sigma analog-to-digital converter which receives a differential analog input signal, an external reference voltage, and an external clock signal, and is capable of communication with a digital system by means of only two conductors and is small enough in size to be packaged in a standard eight lead SOIC package.

It is another object of the invention to provide an integrated circuit delta sigma analog-to-digital converter which receives a differential analog input signal, an external reference voltage, and an external clock signal, is capable of communication with a digital system by means of only two conductors, and is programmable by the digital system.

It is another object of the invention to provide a two-wire interface by means of which a digital system can accomplish all needed communication with a digital port of another system.

Briefly described, and in accordance with one embodiment thereof, the invention includes a delta sigma modulator (103) adapted to produce a stream of pulses (104) the density of which represents the amplitude of an analog input signal ($V_{IN}$) coupled to an input of the delta sigma modulator, a decimation filter (105) coupled to filter the stream of pulses and produce a digital word (106) representing the amplitude of the analog input signal, a serial interface circuit (109) coupled to receive the bits of the output word and serially shift the bits of the digital word to a data terminal (110), and a timing generator (17) operative in response to a clock signal (CLK) to produce timing signals to control operation of the delta sigma modulator 20 and the decimation filter. The timing generator also produces a conversion done signal (21) indicative of completion of conversion of the analog input signal ($V_{IN}$) into the digital word. A control circuit (107) operates in response to the conversion done signal to produce a data ready signal (32) on the data terminal (110) and also operative in response to a digital control signal (SCLK) to cause the serial interface circuit to serially shift the bits of the digital word onto the data terminal.

In the described embodiments, the serial interface circuit (109) includes a shift register (20) having a shift clock input terminal coupled to the control circuit (107), a data input terminal(s) coupled to an output of the decimation filter (105) to receive the data word (106) and an output terminal coupled to the data terminal (110). The timing generator (17) produces the timing signals to control operation of the delta sigma modulator and the decimation filter so as to automatically and repeatedly effectuate a complete conversion of the analog input signal to the digital word and then generate the conversion done signal (21). The timing generator (17) supplies an internal clock signal (53) to the controller circuit (107) in response to the clock signal (CLK). The timing generator (17) also resets an internal timing signal (52) to reset the decimation filter in response to a reset signal (37) produced by the control circuit (107). The control circuit (107) produces a number of shift pulses (18) on the shift clock input terminal equal to the number of bits of the digital word in response to an equal number of pulses of the digital control signal (SCLK). The control circuit (107) operates to detect a first condition wherein the digital control signal (SCLK) is at a first level for a first interval that is at least as long as the duration required to complete a first number of conversion cycles and produces the reset signal (37) on a reset input terminal of the timing generator (17) in response to the detecting. The timing generator (17) performs the functions of resetting the timing sequences of the delta sigma modulator (103) and decimater (105) in response to the reset signal (37). This causes a plurality of the analog-to-digital converters (100), each having its timing generator (17) coupled to the same digital control signal, (SCLK) become internally synchronized when the digital control signal returns from the first level to a second level. The control circuit (107) operates to detect a second condition wherein the digital control signal (SCLK) is at the first level for a second interval that is substantially longer than the first interval and, in response to the detecting, produces a power down signal (38) on a power down input terminal of the delta sigma modulator and also on a power down input terminal of the decimation filter. There is a maximum number of intervals of the clock signal (CLK) that occur from the time of occurrence of the data ready signal (32) during which the current data representing the digital word can be shifted onto the data terminal. A timer (16) in the control circuit (107) counts that number of pulses of the clock signal (CLK) and then reestablishes the condition (40) necessary to start a new analog-to-digital data conversion cycle.

In one embodiment, the serial interface circuit (109) includes a bi-directional interface circuit (24) having a first terminal coupled to the data terminal (110A) and a second terminal coupled to the output terminal (110) of the shift register (20), and the control circuit (107) includes a command register (25) having an input-output port coupled to an input-output port (27) of the bi-directional interface circuit (24) to allow the command register (25) to receive data from the data terminal (110A) via the bi-directional interface circuit (24) and vice versa. The control circuit also includes a state machine circuit (26) operative to decode data in the command register (25) to produce a plurality of programmable control signals. The amplifier is a programmable gain amplifier and one of the programmable control signals is a gain control signal applied to a gain control input of the programmable gain amplifier. Another programmable control signal is applied to the decimation filter to control its decimation ratio. Another programmable control signal is applied to the bi-directional interface circuit to control the direction of information flow on the data terminal (110A).

BRIEF DESCRIPTION OF THE DRAWINGS

FIG. 1 is a detailed block diagram of a first embodiment of an analog-to-digital converter of the invention.

FIG. 2 is a block diagram illustrating connection of the analog-to-digital converter of FIG. 1 to a digital signal processor.

FIG. 3 is a block diagram of the controller 107 and serial port interface circuit 109 of FIG. 1.

FIG. 4 is a timing diagram useful in explaining the operation of the analog-to-digital converter of FIG. 1.

DETAILED DESCRIPTION OF THE PREFERRED EMBODIMENTS

Figure 5:
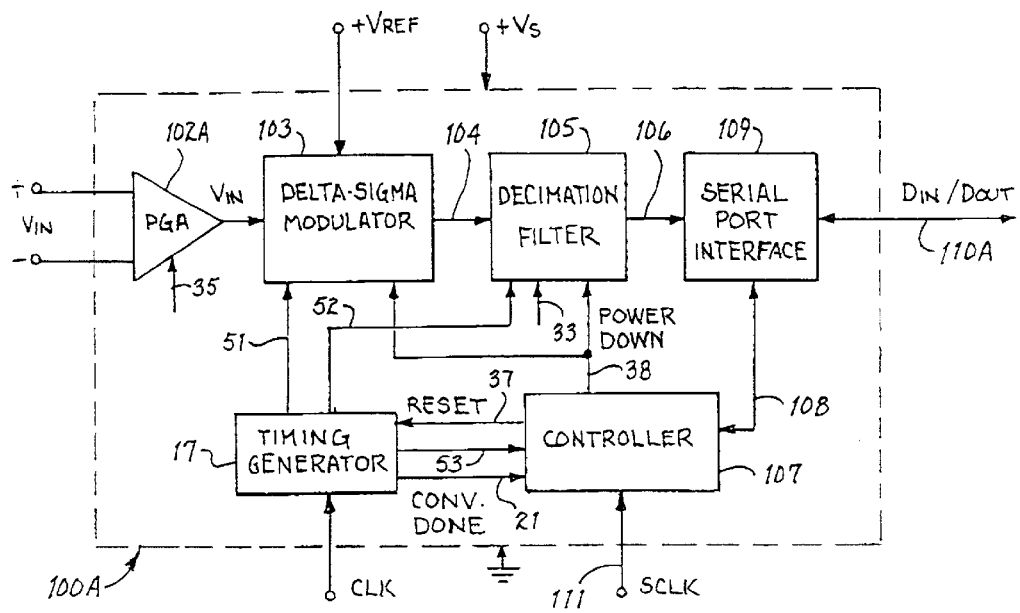
FIG. 5 is a detailed block diagram of another embodiment of an analog-to-digital converter of the present invention which is programmable via a bi-directional input/output port.

FIG. 1 shows a first embodiment 100 of a 24-bit (for example) analog-to-digital converter (ADC). It is formed on a single integrated circuit chip that fits within a small eight lead SOIC package designated by the dashed lines 100A. A standard SOIC package can accommodate an integrated chip as large as 90 mils by 140 mils. A differential analog input signal $V_{IN}$ is applied between two of the leads, and is converted to a corresponding serial digital output word DOUT which initially is loaded into an internal Data Out Shift Register 20 shown in FIG. 3. Later each bit of the digital output word is serially shifted from Data Out Shift Register 20 onto a DOUT/$\overline{DRDY}$ lead 110 in response to individual pulses of a control signal SCLK on conductor 111.

DOUT/$\overline{DRDY}$ lead 110 functions part of the time as an output to conduct the serial bits of DOUT, and also functions during other times as a "data ready" signal $\overline{DRDY}$ to indicate when the bits of the 20-bit signal output word DOUT are available to be serially shifted out of Data Out Shift Register 20 onto lead 110.

The other four of the eight leads of the package 101 are used for applying (1) an ordinary continuous system clock signal CLK, (2) an analog ground signal, (3) a positive power supply voltage $+V_S$, and (4) an external precision reference voltage $+V_{REF}$, respectively, to ADC 100.

ADC 100 includes an amplifier 102 of predetermined gain which produces an amplified input signal $V_{IN}'$ and applies it to the input of a conventional delta-sigma modulator 103. Delta-sigma modulator 103 converts $V_{IN}'$ to a stream of digital pulses 104, the density of which represents the magnitude of $V_{IN}$, to a decimation filter 105. The output of decimation filter 105 is a serial digital signal which has been "grouped" into serial groups of 24 bits (or other suitable word length) constituting 24-bit output words. The serial output bits 106 are applied to inputs of a serial port interface circuit 109, which can shift the serial bits constituting the output word DOUT onto DOUT/$\overline{DRDY}$ lead 110 at an appropriate time.

During each analog-to-digital conversion cycle, the external control signal SCLK provides 24 clock pulses, the number of which is equal to the number of serial bits of the digital output word DOUT. FIG. 4 shows a timing diagram of both the signals produced on DOUT/$\overline{DRDY}$ conductor 110 by ADC 100 and the control signal SCLK applied to conductor 111 by an external microcontroller or digital signal processor (DSP), as shown in FIG. 2. A suitable processor, such as digital signal processor (DSP) 50 shown in FIG. 2, is connected to DOUT/$\overline{DRDY}$ lead 110 to receive the 24-bit serial output word DOUT representing $V_{IN}$. DSP 50 also provides the control signal SCLK to ADC 100 via conductor 111.

An internal timing generator circuit 17 responds to the system clock signal CLK to produce internal control signals on conductors 51 and 52 to control delta sigma modulator 103 and decimation filter 105 such that when power is applied to ADC 100 via the +$V_S$ conductor, amplifier 102, delta-sigma modulator 103, and decimation filter 105 automatically and repeatedly convert $V_{IN}'$ into a serial 24-bit word DOUT in a conventional manner and serially shift the bits thereof via conductor 106 into Data Out Shift Register 20 in FIG. 3. Timing generator 17 also produces a signal on conductor 53 to cause controller 107 to perform the function of loading the output data into the shift register. Timing generator circuit 17 produces a "Conversion Done" signal on conductor 21 at a time indicated by numeral 30 in the timing diagram of FIG. 4. The controller circuit 107 then produces an internal $\overline{DRDY}$ pulse on conductor 19 and passes it through multiplexer 23 to produce the external negative-going DATA READY pulse 32 on conductor 110.

DSP 50 then causes control signal SCLK on conductor 111 to produce 24 pulses 46 as shown in FIG. 4, sequentially clocking the MSB bit, the second MSB bit, etc., and finally the LSB bit out of Data Out Shift Register 20 through multiplexer 23 and onto DOUT/$\overline{DRDY}$ conductor 110. At a time 40 determined by an internal timer 16 shown in FIG. 3, ADC 100 automatically switches DOUT/$\overline{DRDY}$ conductor 110 back to a "1" level to prepare the output port for the next conversion data. At time 30 the new conversion is done, and at the beginning of $\overline{DRDY}$ pulse 32 the new conversion result is available in shift register 20. When SCLK goes low at the time of the $\overline{DRDY}$ pulse 32 in FIG. 4, ADC 100 resets delta sigma modulator 103 and decimation filter 105 so that a new analog-to-digital conversion cycle begins. Timing generator 17 applies an internal timing signal 52 to reset decimation filter 105 in response to reset signal 37 produced by control circuit 107 and also applies an internal clock signal 53 to controller circuit 107 to cause it to start timer 16 to count to the above mentioned time 40. When that new conversion cycle is complete, another external negative-going "data ready" signal $\overline{DRDY}$ appears on DOUT/$\overline{DRDY}$ conductor 110.

FIG. 3 shows more detail of serial port interface circuit 109 and controller 107. Timing generator 17 produces the "Conversion Done" signal on conductor 21, which causes an I/O control circuit 12 in controller circuit 107 to generate the above mentioned internal $\overline{DRDY}$ signal on conductor 19.

This causes multiplexer 23 to produce the above mentioned external negative-going "data ready" pulse 32 of FIG. 4 on conductor 110 to externally indicate that the most recently sampled value of $V_{IN}$ now has been converted to the 24-bit digital word DOUT and is now available (until the next time 40 (FIG. 4) when the next automatic analog-to-digital conversion cycle starts) in Data Out Shift Register 20 to be read out by DSP 50.

DSP 50 can read DOUT out of Data Out Shift Register 20 by generating 24 SCLK pulses 46 as shown in FIG. 4 to shift the 24 bits of DOUT serially out of Data Out Shift Register 20 via conductor 22 through multiplexer 23 and onto DOUT/$\overline{DRDY}$ conductor 110.

DSP 50 also can generate the control signal SCLK so as to perform two control functions. The first control function produces a reset operation if DSP 50 holds SCLK steady at a "1" level for the above mentioned interval equal to four "data conversion periods". I/O control circuit 12 causes timer 16 (FIG. 3) to generate a signal RESET on conductor 37, which causes timing generator 17 to reset and hold the status of the delta sigma modulator and decimation filter 105 and thereby puts the ADC 100 in a hold condition for the beginning of the next analog-to-digital conversion cycle. When DSP 50 returns SCLK to a "0" level, that starts the next internal analog-to-digital conversion cycle. The foregoing reset operation allows DSP 50 to synchronize a number of ADCs 100 which all are connected to receive the same SCLK signal from DSP 50. The synchronization function is very useful in a system in which DSP 50 is required to frequently read values of a large number of analog input signals at the same point in time.

DSP 50 causes the second control function referred to above to produce a power down operation if DSP 50 holds SCLK at a steady "1" level for an interval equal to 20 data conversion periods. I/O control circuit 12 then causes timer 16 to generate the signal POWER DOWN on conductor 38, which switches delta sigma modulator 103 and decimation filter 105 into a low power stand-by operating mode or sleep mode. Whenever DSP 50 returns SCLK to a "0" level, ADC 100 then is returned to a powered up mode.

Figure 8:
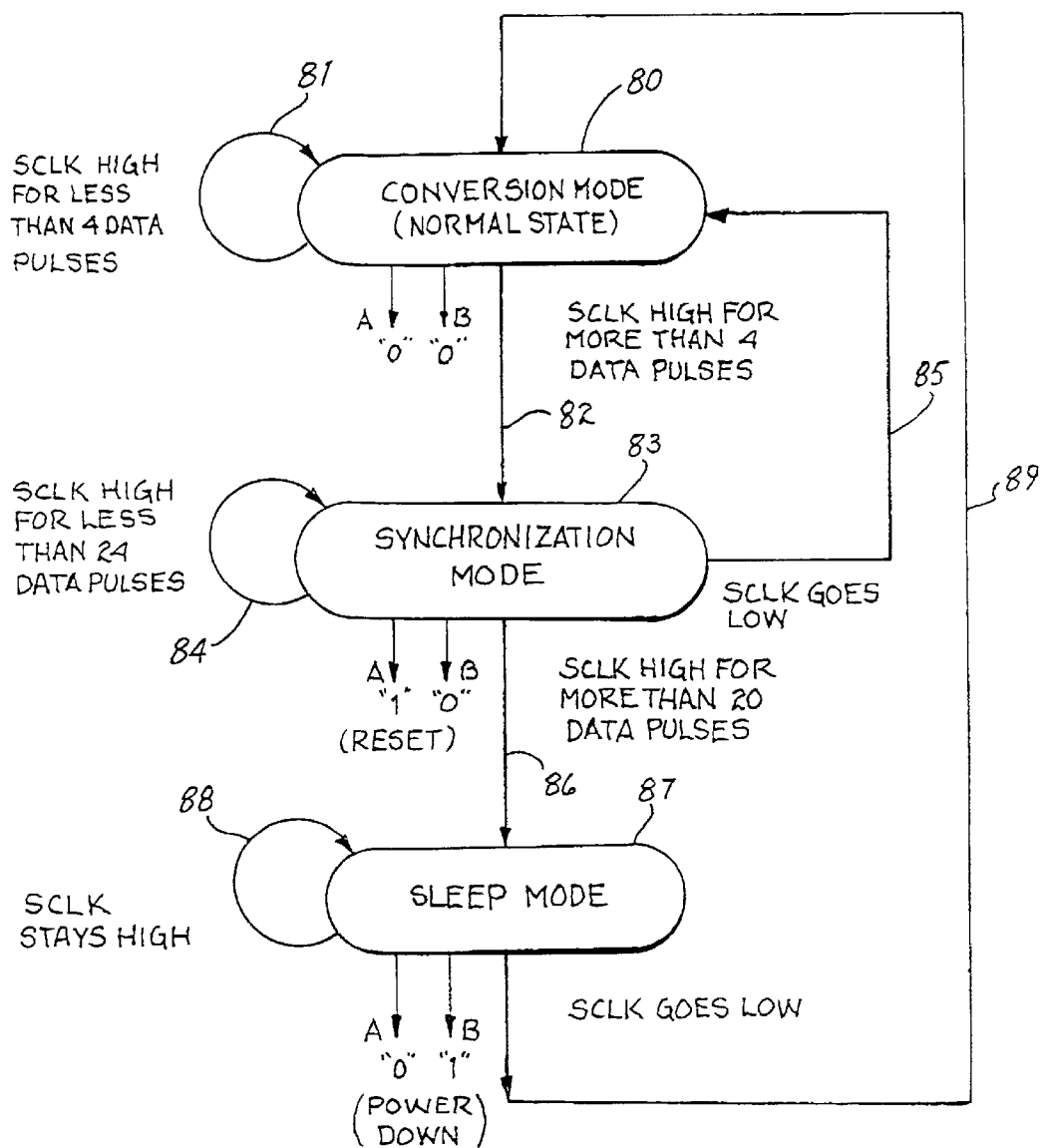
FIG. 8 is a state diagram illustrating the operation of circuitry in controller 107 of FIGS. 1 and 5 to effectuate operation of the analog-to-digital converters 100 and 100A in the conversion mode, synchronization mode, and sleep mode.

FIG. 8 is a state diagram useful in describing the functions implemented by controller 107 of FIGS. 1 and 3. Referring to FIG. 8, label 80 designates the normal "conversion mode" operation of ADC 100. If SCLK is held at a steady "1" level during the conversion mode for less than four analog-to-digital conversion cycles, ADC 100 remains in the conversion mode, as indicated by loop 81. Controller 107 causes circuitry (not shown) of I/O control circuit 12 to continually test the SCLK signal level to make this determination. As long as ADC 100 remains in the conversion mode, a control signal A (subsequently described) is at a "0" level, and a second control signal B (subsequently described) also remains at a "0" level.

However, if SCLK is held high for more than four analog-to-digital conversion cycles, then ADC 100 goes into a "synchronization mode" as indicated by arrow 82 and label 83. Once ADC 100 is in the synchronization mode, it tests SCLK to determine if it is held at a "1" level for less than twenty analog-to-digital conversion cycles. As long as that condition continues, ADC 100 remains in the synchronization mode, as indicated by loop 84.

While in the synchronization mode, ADC 100 produces a "1" level on control signal A and a "0" level on control signal B. The "1" level on control signal A during the synchronization mode constitutes a reset input on conductor 37 to timing generator 17.

If while ADC 100 is in the synchronization mode 83 it detects that SCLK has been held at a "1" level for more than twenty-four analog-to-digital conversion cycles, then ADC 100 goes into a power-down or sleep mode, as indicated by arrow 86 and label 87. During the sleep mode, control signal A is maintained at a "0" and control signal B is maintained at a "1", which represents a power down signal on conductor 38. ADC 100 remains in the sleep mode 87 as long as SCLK remains at a "1" level, as indicated by loop 88. As indicated by arrow 89 and label 80, ADC 100 goes back into the conversion mode when SCLK goes low.

A main advantage of ADC 100 is its capability of communicating to and being controlled by ADC 100 without use of address information to achieve readout of the 24 bit word DOUT using only two leads, namely DOUT/$\overline{\text{DRDY}}$ lead 110 and SCLK lead 111.

Note that the two-conductor communication in the above described ADC 100 differs from the two-conductor communication of the system disclosed in above mentioned U.S. Pat. No. 4,689,740, which uses a two-conductor I²C bus including a data conductor and a clock conductor, in the important respect that no addresses need to be provided by DSP 50 to ADC 100, wherein addresses are required in all I²C systems.

In one design of the system shown in FIGS. 1 and 3, delta sigma modulator 103 operates from a system clock CLK with a frequency of 9.6 megahertz, wherein the system clock frequency is divided by 6 to provide a modulator clock frequency of 1.6 megahertz. The digital filter 105 is a sinc filter which computes the digital result based on the most recent outputs from delta sigma modulator 103. At the most basic level, digital filter 105 can be thought of as simply averaging the modulator results in a weighted form and presenting this average as the digital output. The digital output rate is scaled directly with the frequency of system clock CLK. Since the conversion result is essentially an average, the data output rate determines the location of the resulting notches in the digital filter 105. The data output rate can be set to provide rejection of particular frequencies, such as power line frequencies.

Figure 6:
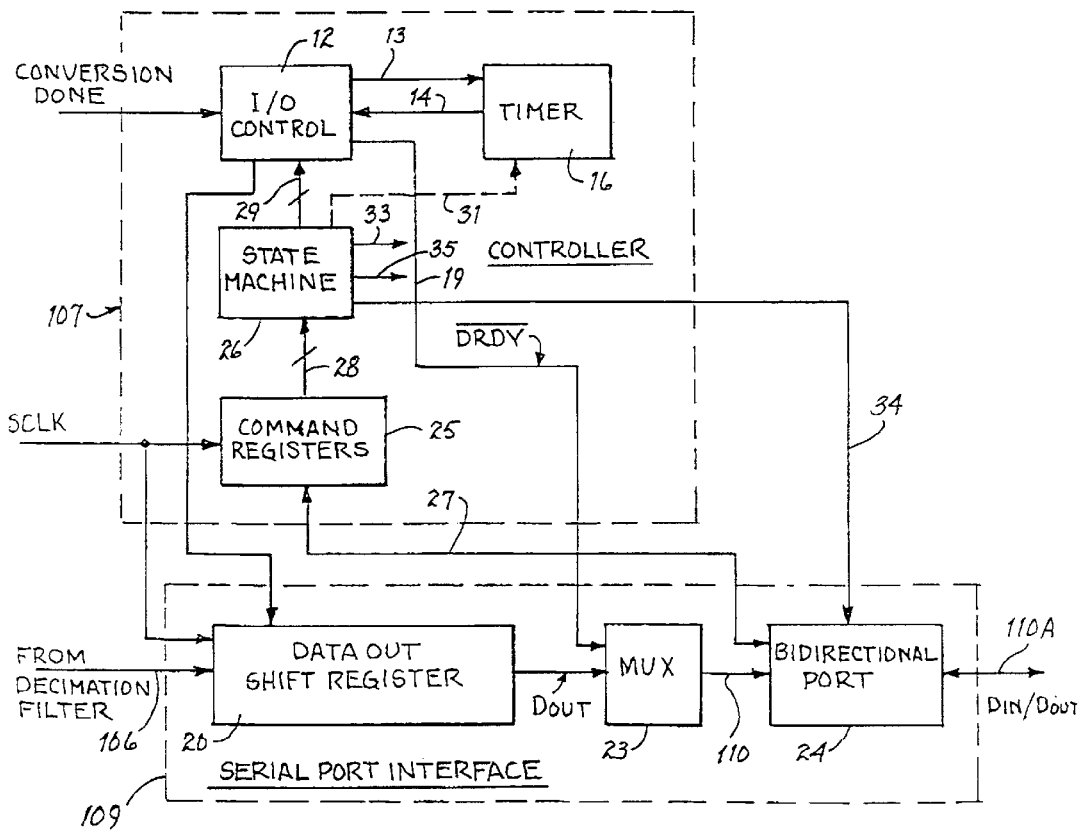
FIG. 6 is a detailed block diagram of the controller 107 and serial port interface 109 of the embodiment of FIG. 5.

FIGS. 5 and 6 show a more complex analog-to-digital converter 100A which has the same eight lead structure as above described ADC 100 of FIG. 1. Referring to FIGS. 5 and 6, ADC 100A includes a programmable gain amplifier 102 the gain of which is variable in response to a signal on conductor 35. The decimation ratio (i.e., the data rate of the delta sigma modulator data with respect to the output data rate of ADC 100A) of decimation filter 105 in FIG. 5 also is programmable in response to an internally generated input signal 33. Data conductor 110A is a bi-directional serial data and control bus. Serial port interface circuit 109, Data Out Shift Register 20, and multiplexer 23 of analog-to-digital converter 100A are described above for FIGS. 1 and 3. ADC 100A also includes a bi-directional port circuit 24. Controller 107 of FIGS. 5 and 6 also includes a command register 25 and a state machine 26, in additional to an I/O control circuit 12 and a timer 16 which are similar to those of FIGS. 1 and 3 described above.

Bi-directional port circuit 24 of FIG. 6 allows DSP 50 (FIG. 2) to input various op codes through bi-directional port circuit 24 and bi-directional conductor 27 into a command register(s) 25 of controller 107. Command register 25 also receives digital programming information via bi-directional port circuit 24. For example, the op codes written by DSP 50 into command register 25 can be input to state machine circuit 26, which decodes the op codes and generates various corresponding control signals on conductors 29, 33, 35, and 34. The op codes determine whether DSP 50 is (1) reading serial data representing $V_{IN}$, (2) reading the contents of the various "subregisters" of command register 25, (3) setting the gain of programmable gain amplifier 102A, and/or (4) setting the decimation ratio of decimation filter 105, respectively.

Figure 7A:
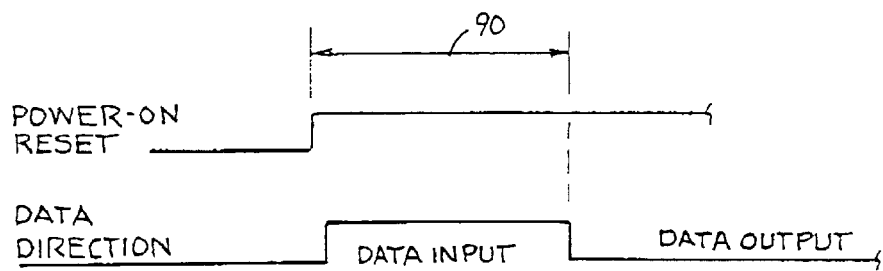
FIG. 7A is a timing diagram illustrating operation of the. bi-directional port of the embodiment of FIGS. 5 and 6 during a power-up operation.

The timing diagram of FIG. 7A shows that bi-directional port circuit 24 is configured so that data terminal 110A is an input for an internally generated time out period 90 when ADC 100A is "powered up". ADC 100A is powered up either by having a normal supply voltage applied to its $+V_S$ terminal or in response to an initial power-up signal applied on conductor 38 at the end of the power-down or sleep mode.

Figure 7B:
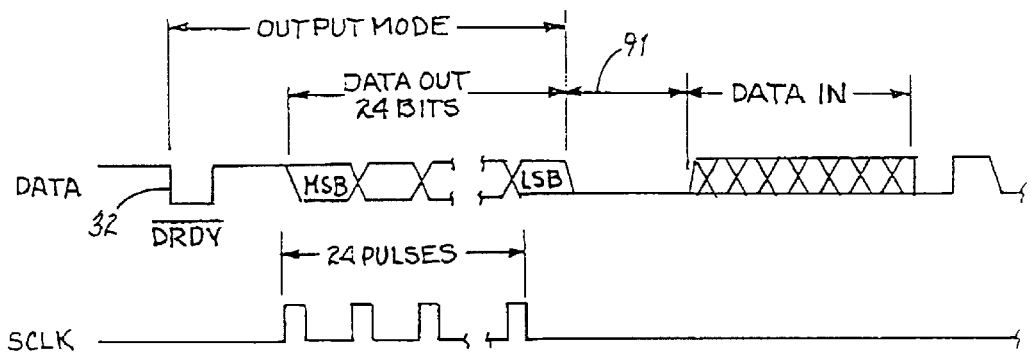
FIG. 7B is a timing diagram useful in explaining operation of the bi-directional port of the embodiment of FIGS. 5 and 6 during normal communications with a DSP or microcontroller.

FIG. 7B shows the waveforms on data terminal 110A and SCLK during normal bi-directional communications between ADC 100A and DSP 50 (FIG. 2). State machine 26 configures bi-directional port circuitry 24 so that data terminal 110A is a data output terminal during a period that begins when the $\overline{\text{DRDY}}$ pulse occurs at time 32 and continues long enough for 24 bits of data to be shifted out of Data Out Shift Register 20 through bi-directional port circuit 24 to data terminal 110A. Then, after a transition period 91, state machine 26 configures bi-directional port circuit 24 so that data terminal 110A is an input terminal for a sufficiently long duration to allow all of the subregisters of command register 25 to be programmed by DSP 50 and to accomplish the next analog-to-digital conversion operation.

Figure 7C:
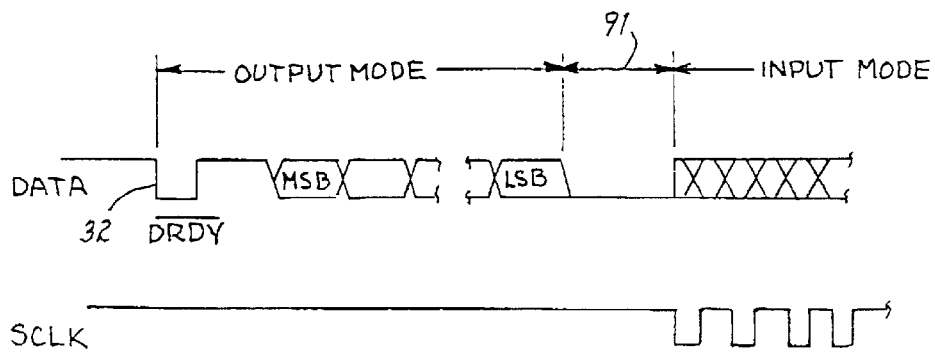
FIG. 7C is a timing diagram illustrating an alternative technique for operation of the bi-directional port of the embodiment of FIGS. 5 and 6 during normal communications with a DSP or microcontroller.

FIG. 7C illustrates a possible alternative way of setting the direction of data flow through serial port interface circuit 109, wherein state machine 26 configures bi-directional port 24 so that data terminal 110A is an input if SCLK is held at a "1" level for more than one analog-to-digital conversion cycle. In this case, the input mode continues until ADC 100A receives an instruction command to output the data.

The capability of ADC 100A to allow DSP 50 to program the gain, data output rate, and/or various other parameters via data terminal 110A avoids the need for additional terminals to accomplish these functions, and also provides a great deal of flexibility in configuring the use of ADC 100A in a system.

Figure 9:
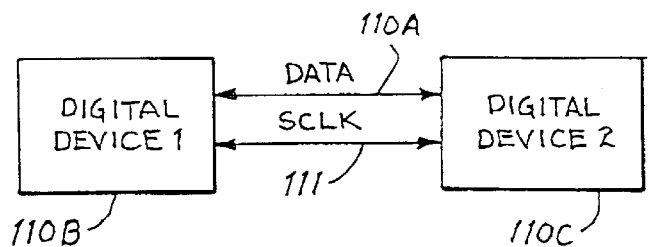
FIG. 9 is a block diagram of an alternate embodiment of the invention including two digital devices, at least one of which includes a bi-directional serial port interface circuit as shown in FIG. 6.

Referring to FIG. 9, a first digital device 100B, which need not be either ADC 100 or ADC 100A previously described, may include a serial port interface circuit similar to serial port interface 109 of FIG. 1 or FIG. 5. Similarly, a second digital device 110C also may include a serial port interface circuit similar to serial port interface 109 of FIG. 1 or FIG. 5. The serial port interface circuit of at least one of digital devices 100B and 100C is a bi-directional serial port interface circuit similar to the one shown in FIG. 6. The data terminal of second digital device 100B is connected by conductor 100A to the data terminal of digital device 100C. The SCLK terminals of digital devices 100B and 100C are connected to conductor 111. At least one of digital devices 100B and 110C is capable of generating control signals on SCLK conductor 111. At least one of digital devices 100B and 100C is capable of both receiving data from and writing data into the data terminal of the other.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. As an example of this embodiment of the invention, a DSP can input data to and interrogate a digital port of any other device or system by means of the bi-directional serial port interface. For example, a DSP can be coupled to the digital input port of a digital-to-analog converter in a noisy system to provide a digital word as an input to be converted to an analog signal, and use the SCLK terminal to read the same digital word back to assure that no transmission error occurred.

Other circuitry than that disclosed could be used to establish when the data terminal 100A functions as an input and when it functions as an output. For example, time slots could be established for SCLK wherein a particular sequence of SCLK pulses or a particular duration of a SCLK pulse could be decoded to provide the above reset function or power down function or any other control function achievable in response to the SCLK signal. Various other programmable functions could be provided, for example to select the clock rate of the delta sigma modulator, to select values of internal reference voltages, to adjust the range of digital output values, to select internal multiplexer channel settings, to adjust analog power level, and/or many other parameters. As another example, the control functions accomplished by the described use of SCLK could be accomplished by similarly controlling CLK instead.

We claim:
1. An analog-to-digital converter comprising:
   (a) a delta sigma modulator adapted to produce a stream of pulses the density of which represents the amplitude of an analog input signal coupled to an input of the delta sigma modulator;
   (b) a decimation filter coupled to filter the stream of pulses and produce a digital word representing the amplitude of the analog input signal;
   (c) a serial interface circuit coupled to receive the bits of the digital word and serially shift the bits of the digital word to a single data terminal;
   (d) a timing generator operative in response to a clock signal to produce timing signals to control operation of the delta sigma modulator and the decimation filter, the timing generator also producing a conversion done signal indicative of completion of conversion of the analog input signal into the digital word; and
   (e) a control circuit operative in response to the conversion done signal to produce a data ready signal on the data terminal and also operative in response to a single digital control signal to cause the serial interface circuit to serially shift the bits of the digital word onto the data terminal,
   wherein two-wire communication with the analog-to-digital converter is accomplished by the single data terminal and the single digital control signal.
2. The analog-to-digital converter of claim 1 wherein the analog input signal is a differential input signal, the analog-to-digital converter including a differential amplifier having a pair of input terminals coupled to receive the differential input signal and an output terminal coupling an amplifier representation of the differential input signal to the input of the delta sigma modulator.
3. The analog-to-digital converter of claim 2 wherein the serial interface circuit includes a shift register having a shift clock input terminal coupled to the control circuit, a data input terminal coupled to an output of the shift register to receive the digital word and an output terminal coupled to the data terminal.

4. The analog-to-digital converter of claim 3 wherein the control circuit produces a number of shift pulses on the shift clock input terminal equal to the number of bits of the digital word in response to an equal number of pulses of the digital control signal.

5. The analog-to-digital converter of claim 3 wherein the control circuit operates to detect a first condition wherein the digital control signal is at a first level for a first interval that is at least as long as the duration required to complete a first number of analog-to-digital conversion operations and produces a reset signal on a reset input terminal of the timing generator in response to the detecting.

6. The analog-to-digital converter of claim 5 wherein the timing generator resets the decimation filter in response to the reset signal, wherein a plurality of the digital-to-analog converters each having its timing generator coupled to the same digital control signal become internally synchronized when the digital control signal returns from the first level to a second level.

7. The analog-to-digital converter of claim 5 wherein the control circuit operates to detect a second condition wherein the digital control signal is at the first level for a second interval substantially longer than the first interval and produces a power down signal on a power down input terminal of the delta sigma modulator and a power down input terminal of the decimation filter in response to that detecting.

8. The analog-to-digital converter of claim 3 wherein the timing generator operates in response to the clock signal to generate the conversion done signal a predetermined amount of time after the starting of an analog-to-digital conversion cycle by the delta sigma modulator and the decimation filter.

9. The analog-to-digital converter of claim 8 wherein the timing generator produces the timing signals to control operation of the delta sigma modulator and the decimation filter so as to effectuate a complete conversion of the analog input signal to the digital word and then generate the conversion done signal.

10. The analog-to-digital converter of claim 9 wherein the timing generator automatically repetitively produces the timing signals so as to automatically and repetitively effectuate conversion of successive values of the analog input signal to corresponding digital words.

11. The analog-to-digital converter of claim 3 wherein the serial interface circuit includes a bi-directional port circuit having a first terminal coupled to the data terminal, a second terminal coupled to the output terminal of the shift register, the control circuit including a command register having an input terminal coupled to a third terminal of the bi-directional port circuit to allow the command register to send and receive data to and from the data terminal via the bi-directional port circuit, and a state machine circuit operative to decode data in the command register to produce a plurality of programmable control signals.

12. The analog-to-digital converter of claim 11 wherein the amplifier is a programmable gain amplifier and one of the programmable control signals is a gain control signal applied to a gain control input of the programmable gain amplifier.

13. The analog-to-digital converter of claim 11 wherein one of the programmable control signals is a decimation ratio control signal and is applied to a decimation ratio control input of the decimation filter.

14. The analog-to-digital converter of claim 11 wherein one of the programmable control signals is a direction control signal and is applied to a direction control input of the bi-directional interface circuit.

15. A method of operating a digital system using two-wire communication to acquire a digital representation of an analog input signal, comprising:

(a) providing an analog-to-digital converter including a delta sigma modulator adapted to produce a stream of pulses the density of which represents the amplitude of an analog input signal coupled to an input of the delta sigma modulator, a decimation filter coupled to filter the stream of pulses and produce a digital word at a lower data rate representing the amplitude of the analog input signal, and a serial interface circuit coupled to receive the digital word and serially shift the bits of the digital word to a single data terminal;

(b) producing internal timing signals to control operation of the delta sigma modulator and the decimation filter in response to one external clock signal;

(c) producing an internal conversion done signal indicative of completion of each conversion of the analog input signal into the digital word; and (d) providing communication between the analog-to-digital converter and the digital system by causing the analog-to-digital converter to produce a data ready signal on the data terminal in response to the conversion done signal and by causing the serial interface circuit to serially shift the bits of the digital word onto the data terminal in response to a single digital control signal.

16. The method of claim 15 wherein the serial interface circuit includes a shift register having a shift clock input terminal coupled to the control circuit, a data input terminal coupled to an output of the decimation filter to receive the data word and an output terminal coupled to the data terminal, the method including producing a number of shift pulses on the shift clock input terminal equal to the number of bits of the digital word in response to an equal number of pulses of the digital control signal.

17. The method of claim 16 including providing a bi-directional port circuit having a first terminal coupled to the data terminal, a second terminal coupled to the output terminal of the shift register, wherein the control circuit includes a command register having an input terminal coupled to a third terminal of the bi-directional port circuit producing data on the data terminal and directing the data through the bi-directional port circuit into a command register, and decoding the data in the command register to produce an internal programmable control signal.

18. The method of claim 17 including applying the internal programmable control signal to a gain control input of the differential gain amplifier.

19. The method of claim 17 including applying the internal programmable control signal to a decimation ratio control input of the decimation filter.

20. The method of claim 15 including detecting a first condition wherein the digital control signal is at a first level for a first interval that is at least as long as the duration required to complete a first number of analog-to-digital conversion operations and producing a reset signal in response to the detecting.

21. The method of claim 20 including detecting a second condition wherein the digital control signal is at the first level for a second interval substantially longer than the first interval and producing a power down signal on a power down input terminal of the delta sigma modulator and a power down input terminal of the decimation filter in response to that detecting.

22. A non-addressable analog-to-digital converter comprising:

(a) a delta sigma modulator adapted to produce a stream of pulses the density of which represents the amplitude of an analog input signal coupled to an input of the delta sigma modulator;

(b) a decimation filter coupled to filter the stream of pulses and produce a digital word representing the amplitude of the analog input signal;

(c) a serial interface circuit coupled to receive the bits of the digital word and serially shift the bits of the digital word to a single data terminal;

(d) a timing generator operative in response to a clock signal to produce timing signals to control operation of the delta sigma modulator and the decimation filter; and (e) a control circuit operative in response to completion of conversion of the analog input signal into the digital word to produce a data ready signal on the data terminal and also operative in response to a single digital control signal to cause the serial interface circuit to serially shift the bits of the digital word onto the data terminal, wherein two-wire communication with the analog-to-digital converter is accomplished by the single data terminal and the single digital control signal.

23. A system for two-wire communication, comprising:

(a) a first device having a first digital port including a single first data terminal and a single first control terminal;

(b) a second device having a second digital port including a second data terminal coupled to the first data terminal and a second control terminal coupled to the first control terminal;

(c) a serial interface circuit in the first device coupled to receive the bits of a digital word and serially shift the bits of the digital word to the first data terminal;

(d) a timing generator operative in response to a clock signal to produce timing signals to control operation of the serial interface circuit; and (e) a control circuit in the first device operative to produce a data ready signal on the first data terminal and also operative in response to a digital control signal produced on the second control terminal by the second device to cause the serial interface circuit to serially shift the bits of the digital word onto the first data terminal.

24. The system of claim 23 wherein the serial interface circuit includes a shift register having a clock shift input terminal coupled to the control circuit, a data input terminal to receive the digital word, and an output terminal coupled to the data terminal.

25. The system of claim 24 wherein the control circuit produces a number of shift pulses on the clock shift input terminal equal to the number of bits of the digital word in response to an equal number of pulses of the digital control signal.

26. The system of claim 25 wherein the serial interface circuit includes bi-directional port circuitry having a first terminal coupled to the data terminal, a second terminal coupled to the output terminal of the shift register, the control circuit including a command register having an input terminal coupled to a third terminal of the bi-directional port circuitry to allow the command register to send and receive data to and from the data terminal via the bi-directional port circuitry, the control circuit also including a state machine circuit operative to decode data in the command register to produce at least one programmable control signal operative to control a parameter of a circuit in the first device.

27. An analog-to-digital converter comprising:

(a) a delta sigma modulator adapted to produce a stream of pulses the density of which represents the amplitude of an analog input signal coupled to an input of the delta sigma modulator;

(b) a decimation filter coupled to filter the stream of pulses and produce a digital word representing the amplitude of the analog input signal;

(c) a serial interface circuit coupled to receive the bits of the digital word and serially shift the bits of the digital word to a data terminal;

(d) a timing generator operative in response to a clock signal to produce timing signals to control operation of the delta sigma modulator and the decimation filter, the timing generator also producing a conversion done signal indicative of completion of conversion of the analog input signal into the digital word; and (e) a control circuit operative in response to the conversion done signal to produce a data ready signal on the data terminal and also operative in response to a digital control signal to cause the serial interface circuit to serially shift the bits of the digital word onto the data terminal, wherein the analog input signal is a differential input signal, the analog-to-digital converter including a differential amplifier having a pair of input terminals coupled to receive the differential input signal and an output terminal coupling an amplifier representation of the differential input signal to the input of the delta sigma modulator, wherein the serial interface circuit includes a shift register having a shift clock input terminal coupled to the control circuit, a data input terminal coupled to an output of the shift register to receive the digital word and an output terminal coupled to the data terminal, and wherein the serial interface circuit includes a bi-directional port circuit having a first terminal coupled to the data terminal, a second terminal coupled to the output terminal of the shift register, the control circuit including a command register having an input terminal coupled to a third terminal of the bi-directional port circuit to allow the command register to send and receive data to and from the data terminal via the bi-directional port circuit, and a state machine circuit operative to decode data in the command register to produce a plurality of programmable control signals.

28. The analog-to-digital converter of claim 27 wherein the amplifier is a programmable gain amplifier and one of the programmable control signals is a gain control signal applied to a gain control input of the programmable gain amplifier.

29. The analog-to-digital converter of claim 27 wherein one of the programmable control signals is a decimation ratio control signal and is applied to a decimation ratio control input of the decimation filter.

30. The analog-to-digital converter of claim 27 wherein one of the programmable control signals is a direction control signal and is applied to a direction control input of the bi-directional interface circuit.

* * * * *